United States Patent [19]

Doehler et al.

[11] Patent Number: 4,893,584
[45] Date of Patent: Jan. 16, 1990

[54] LARGE AREA MICROWAVE PLASMA APPARATUS

[75] Inventors: Joachim Doehler, Union Lake; Jeffrey M. Krisko, Highland, both of Mich.

[73] Assignee: Energy Conversion Devices, Inc., Troy, Mich.

[21] Appl. No.: 174,659

[22] Filed: Mar. 29, 1988

[51] Int. Cl.$^4$ .................................................. C23C 16/48
[52] U.S. Cl. ........................... 118/723; 156/345; 315/39; 427/38; 427/45.1
[58] Field of Search ............... 118/718, 723; 427/38, 427/45.1; 156/345, 643; 204/192.1, 298 R, 298 E; 313/231.31; 315/39, 111.21

[56] References Cited

U.S. PATENT DOCUMENTS

| 3,374,393 | 3/1968 | Bramley | 315/39 |
| 3,814,983 | 6/1974 | Weissfloch et al. | 315/39 |
| 4,481,229 | 11/1984 | Suzuki et al. | 427/38 |
| 4,504,518 | 3/1985 | Ovshinsky et al. | 427/38 |
| 4,512,868 | 4/1985 | Fujimura et al. | 156/345 |
| 4,517,223 | 5/1985 | Ovshinsky et al. | 427/39 |
| 4,521,717 | 6/1985 | Kieser | 315/39 |
| 4,581,100 | 4/1986 | Hatzakis et al. | 156/345 |
| 4,729,341 | 3/1988 | Fournier et al. | 427/39 |
| 4,776,918 | 10/1988 | Otsubo et al. | 156/345 |

OTHER PUBLICATIONS

Asmussen, J. and M. Dahimene, "The Experimental Test of a Microwave Ion Beam Source in Oxygen", J. Vac. Sci. Technol. B 5(1) (Jan./Feb. 1987), pp. 328-331.
M. Dahimene & J. Asmussen, "The Performance of Microwave Ion Source Immersed in a Multicusp Static Magnetic Field", J. Vac. Sci. Tech. B-4 (Jan.-Feb. 1986) pp. 126-130.

Primary Examiner—Richard Bueker
Assistant Examiner—Terry J. Owens
Attorney, Agent, or Firm—Marvin S. Siskind; Richard M. Goldman

[57] ABSTRACT

Microwave energy apparatus adapted to sustain a substantially uniform plasma over a relatively large area. In the broadest form of the invention, an isolating window is disposed about the microwave applicator, said isolating window formed from a material through which the microwave energy can be transmitted from the applicator into a plasma reaction vessel and said isolating window configured in a shape which is substantially optimized to withstand compressive forces. In this manner, the thickness of the isolating window may be minimized to provide for rapid thermal cooling, whereby high power densities may be achieved without cracking the window.

54 Claims, 3 Drawing Sheets

LARGE AREA MICROWAVE PLASMA APPARATUS

FIELD OF THE INVENTION

The instant invention relates generally to microwave energy apparatus for sustaining a substantially uniform plasma over a relatively large area and more particularly to a novel microwave energy apparatus for effecting a uniform microwave initiated glow discharge plasma over a large area. The microwave energy apparatus includes a vacuum vessel for sustaining a plasma, a source of process gas, and microwave applicator adapted to either radiate microwave energy or transmit microwave energy via evanescent waves into the interior of said vacuum vessel. The microwave energy apparatus further includes an isolating window for separating the microwave applicator from the plasma region developed in the vacuum vessel. The microwave energy apparatus is adapted to effect a substantially uniform plasma reaction upon a substrate disposed within the near field distance of the microwave applicator.

BACKGROUND OF THE INVENTION

Due to the recent proliferation of the kitchen microwave oven, "microwave" has become literally a household word. As a result of the knowledge gained by the mass production of these ovens, the per kilowatt cost of efficient microwave energy sources has fallen precipitously, opening a broad range of new applications in both commercial and industrial settings. One application is the use of microwave energy to efficiently initiate and sustain plasmas for use in plasma treatment processes, semiconductor etching, thin film deposition processes and other processes.

While the conventional microwave oven is designed to be adequate to uniformly heat food products through the use of mechanical means to average out microwave energy non-uniformities and while taking advantage of the relatively long thermal relaxation times of the food products which are being heated, the same techniques cannot be used for the task of uniformly exciting gases to create a plasma because of their short relaxation times. The fans and other mechanical "microwave dispersers" used in oven technology, are unable, regardless of how fast they can practically turn, to assure a uniform dispersion of microwave energy, on a time scale appropriate to plasma excitation. To accomplish the uniform microwave excitation of a plasma other means must be employed. Prior examples of microwave plasma deposition techniques are illustrative of the state of the art and highlight both the problems encountered in increasing the energy uniformity and the advantages provided by the novel microwave plasma generating structure of the instant invention.

Commonly assigned, U.S. Pat. Nos. 4,517,223 and 4,504,518 to Ovshinsky, et al, both entitled "METHOD OF MAKING AMORPHOUS SEMICONDUCTOR ALLOYS AND DEVICES USING MICROWAVE ENERGY", the disclosures of which are incorporated herein by reference, describe processes for the deposition of thin films onto small area substrates in a low pressure, microwave glow discharge plasma. As specifically noted in these Ovshinsky, et al patents, operation in the disclosed low pressure regimes not only eliminates powder and polymeric formations in the plasma, but also provides the most economic mode of plasma deposition. While these patents describe a truly remarkable regime of low pressure and high energy density, deposition utilizing microwave energy, i.e., at substantially the minimum of the Paschen curve, the problem of uniformity of deposition over large areas remains unaddressed.

Turning now to microwave applicators for large area substrates, commonly assigned U.S. Pat. No. 4,729,341 of Fournier, et al, for "METHOD AND APPARATUS FOR MAKING ELECTROPHOTOGRAPHIC DEVICES", the disclosure of which is incorporated by reference, describes a low pressure microwave initiated plasma process for depositing a photoconductive semiconductor thin film on a large area cylindrical substrate using a pair of radiative waveguide applicators in a high power process. However, the principles of large area deposition described therein are limited to cylindrically shaped substrates, such as electrophotographic photoreceptors, and the teachings provided therein are not directly transferable to large area, generally planar substrates.

Many workers in the field have disclosed methods of processing thin films utilizing the high power of microwave sustained plasmas. However, microwave plasmas have not been altogether appropriate for large surface area and/or low pressure deposition. This is because of the non-uniformity of the resulting surface treatment, a consequence of the non-uniformity of the energy. One attempt to provide greater uniformly was the use of a slow wave microwave structure. A problem that is inherent in slow wave structures, however is the very rapid fall off of microwave coupling into the plasma as a function of distance transverse to the microwave applicator. This problem has been addressed in the prior art by various structures that vary the spacing of the slow wave structure from the substrate to be processed. In this way the energy density at the surface of the substrate is constant along the direction of movement of the substrate. For example, U.S. Pat. No. 3,814,983 to Weissfloch, et al for "APPARATUS AND METHOD FOR PLASMA GENERATION AND MATERIAL TREATMENT WITH ELECTROMAGNETIC RADIATION" and U.S. Pat. No. 4,521,717 to Kieser, et al, for "APPARATUS FOR PRODUCING A MICROWAVE PLASMA FOR THE TREATMENT OF SUBSTRATE IN PARTICULAR FOR THE PLASMA POLYMERIZATION OF MONITORS THEREON", both address this problem by proposing various spatial relationships between the microwave applicator and the substrate to be processed.

The slow wave structure is described, for example in U.S. Pat. No. 3,814,983 to Weissfloch, et al, for "APPARATUS AND METHODS FOR PLASMA GENERATION AND MATERIAL TREATMENT WITH ELECTROMAGNETIC RADIATION" and in U.S. Pat. No. 4,521,717 to Kieser, et al, for "APPARATUS FOR PRODUCING A MICROWAVE PLASMA FOR THE TREATMENT OF SUBSTRATES, IN PARTICULAR FOR THE PLASMA-POLYMERIZATION OF MONITORS THEREON". More particularly, the Weissfloch, et al patent discloses the problems encountered in obtaining uniform field intensity. Weissfloch, et al discloses that in order to obtain the uniform electric field intensity necessary for a plasma of uniform power density along the full length of the slow wave waveguide structure, it is necessary to incline the waveguide structure at an angle with respect to the substrate. Inclination of the slow wave waveguide structure to achieve uniformity with respect to the substrate leads to an inefficient coupling of microwave energy into the plasma.

Recognizing this deficiency of the slow wave structure, Kieser, et al proposed the use of two waveguide structures in an anti-parallel arrangement. In this way the energy inputs of the two structures are superimposed one upon the other. More particularly, Kieser, et al described that the conditions resulting from superposing of two energy inputs, i.e., two microwave applicators, can be further improved if the two slow wave applicators are set at an angle to each other such that the planes normal to the medians of the applicators intersect at a straight line which extends parallel to the surfaces of the substrate to be treated and at right angles to the travel direction of the substrate. Moreover, Kieser, et al recommend that in order to avoid destructive interference of the wave field patterns of the two applicators, the applicators should be displaced from each other transversely of the travel direction of the substrate by a distance equal to half of the space between the cross-bars of the waveguide. Kieser, et al disclose that in this way the microwave field pattern is substantially suppressed.

The problem of plasma uniformity and more particularly, energy uniformity is treated by J. Asmussen and his co-workers, for example in T. Roppel, et al "LOW TEMPERATURE OXIDATION OF SILICON USING A MICROWAVE PLASMA DISC SOURCE", *J. Vac. Sci. Tech.* B-4 (January-February 1986) pp. 295-298 and M. Dahimene and J. Asmussen "THE PERFORMANCE OF MICROWAVE ION SOURCE IMMERSED IN A MULTICUSP STATIC MAGNETIC FIELD" *J. Vac. Sci. Tech.* B-4 (January-February 1986) pp. 126-130. In these as well as other papers, Asmussen and his co-workers describe a microwave reactor which they refer to as a microwave plasma disc source ("MPDS"). The plasma is reported to be in the shape of a disc or tablet, with a diameter that is a function of microwave frequency. A critical advantage claimed by Asmussen and his co-worker is that the plasma disc source is scalable with frequency, that is, at the normal microwave frequency of 2.45 gigahertz the plasma disc diameter is 10 centimeters and the plasma disc thickness is 1.5 centimeters but that the disc diameter can be increased by reducing the microwave frequency. Asmussen and his co-workers disclose that in this way the plasma geometry is scalable to large diameters, potentially yielding a uniform plasma density over a large surface area. However, Asmussen only describes a microwave plasma disc source which is designed for operation at 2.45 gigahertz, where the plasma confined diameter is 10 centimeters and the plasma volume is 118 cubic centimeters. This is far from a large surface area. Asmussen and his co-workers, however, propose a system designed for operation at the lower frequency of 915 megahertz, saying that the lower frequency source would provide a plasma diameter of approximately 40 centimeters with a plasma volume of 2000 cubic centimeters.

Asmussen and his co-workers further describe that the microwave plasma disc source can be used as a broad beam ion source or as a plasma source for material processing and can be scaled up to discharge diameters in excess of 1 meter by operating at still lower frequencies, for example 400 megahertz. The microwave plasma disc source of Asmussen and his co-workers, while, in principle, providing the relatively large surface area requires frequency adjustment to do so. There are severe economic consequences of this approach to variation of the dimensions of a plasma processing machine. Only 2.45 GHz magnetrons have been developed to be both inexpensive and to have large power capabilities. High power microwave sources at other fixed frequencies remain expensive and variable frequency high power microwave sources are *extremely* expensive.

Furthermore, the deposited material quality and deposition rate is dependent on excitation frequency. This changing frequency to increase plasma dimensions may entail compromises in material quality and film deposition rate. Additionally, the magnets which are used in the system disclosed by Asmussen must be made larger in size, and different in field strength as the excitation frequency is changed. Thus, as a means of changing the plasma dimensions, Asmussen's approach has the disadvantage of rigidly coupling other important deposition parameters and therefore reducing operational flexibility.

Workers at Hitachi have described, for example in U.S. Pat. No. 4,481,229 to Suzuki, et al the use of electron cyclotron resonance to obtain a high power plasma having relatively high degree of uniformity over a limited surface area. However, the Hitachi patent does not teach, nor even suggest a method by which uniform large area plasmas may be achieved. Moreover, the use of electron cyclotron resonance imposes the added requirement of an additional highly uniform magnetic field structures in the microwave apparatus, and may be restricted in operation to only those very low pressure regimes where electron collision times are long enough to allow the cyclotron resonance condition to be achieved.

U.S. Pat. Nos. 4,517,223 and 4,729,341 referred to above, describe the necessity of using very low pressures in very high microwave power density plasmas. The use of low pressures in necessary in order to obtain high deposition rates and/or high gas utilization; U.S. Pat. Nos. 4,517,223 and 4,729,341 emphasize the criticality of low plasma pressure in order to economically carry out the plasma processes. However, the relationship between high deposition rates, high gas utilization, high power density, and low pressure further limits the utility of slow wave structures and electron-cyclotron resonance methods. The limitations of the slow wave structure and of the electron-cyclotron resonance methods are obviated and the deposition rates and low pressure regimes described in the aforementioned U.S. Pat. Nos. 4,517,223 and 4,729,341 are obtained by the method and apparatus described hereinbelow.

BRIEF SUMMARY OF THE INVENTION

There is disclosed herein microwave energy apparatus for sustaining a substantially uniform plasma over a relatively large area. More specifically, the apparatus includes a vacuum vessel for initiating, sustaining, and containing a plasma, i.e., in a plasma region thereof, means disposed in said vessel for supporting a substrate in operatively juxtaposed position relative to the plasma region, means for maintaining the vessel at a desired substantially sub-atmospheric pressure, means for introducing process gases into the vessel, applicator means at least partially extending into the interior of the vessel and adapted to radiate microwave energy from a source into the interior of said vessel, and means for isolating the microwave radiating applicator means from the plasma region. The isolating means is formed from a material through which microwave energy can be radiated from the applicator means into the vessel and is configured in a shape substantially optimized to withstand the pressure differential to which it may be exposed. In this manner, the thickness of the isolating means may be minimized and a substantially uniform plasma operation may be performed along an elongated surface of a substrate means disposed in said vessel.

The isolating means is preferably cylindrically or hemi-cylindrically shaped so as to encapsulate at least that portion of the applicator means which extends into the vessel, though other generally smoothly curved surfaces may be employed with equal success. A vacuum seal is disposed between the cylindrically shaped isolating means and the vessel wall, so that a pressure differential may be maintained between the interior and the exterior of the cylindrically-shaped isolating means. Accordingly, pressure (vacuum) maintaining means is provided to maintain the pressure (vacuum) of said vessel disposed exteriorly of said cylindrically-shaped isolating means at a pressure approximating that required for plasma operation near the minimum of a modified Paschen curve. The thickness of the circumferential wall of the isolating means is designed to withstand that pressure differential which exists between the exterior and interior thereof.

The vacuum vessel may perform different plasma operations. In a first embodiment, at least one deposit precursor gas, e.g., a semiconductor element-containing gas, is introduced into the interior of the vacuum vessel for depositing a material, as a metal, a semiconductor alloy material, a superconducting alloy material, or a dielectric (including organic polymeric material) onto the substrate means. In another preferred embodiment, precursor gases are provided so as to decompose and deposit an insulating film onto the substrate. In yet another preferred embodiment, at least one etchant-containing precursor gas is provided for introduction into the interior of said vessel, whereby said apparatus is adapted to etch the surface of a deposit or of a substrate means.

The applicator means preferably takes the form of an elongated waveguide which includes at least one aperture or leak for substantially uniformly radiating microwave energy therefrom into the interior of the vacuum vessel. It is to be understood that the size of the apertures may be periodic or aperiodic, and the size of the aperture may be equal to or less than one wavelength of the microwave energy. In another embodiment, a plurality of apertures are spacedly positioned along the longitudinal extent of the waveguide. Here, as above, the size and spacing of the apertures may be either periodic or aperiodic.

The apparatus may further include an elongated substrate, which may be a single elongated member, a plurality of discrete small substrate members aligned along the longitudinal extent of the waveguide, or an elongated web adapted to be continuously moved past the longitudinal extent of the waveguide. The substrate means may either be substantially planar or slightly curved. In either event, it is preferred that the substrate means is operatively disposed within a near field distance of said applicator means. The uniformly radiating means is adapted to substantially uniformly radiate microwave energy from the waveguide over a dimension greater than one wavelength of the radiated microwaves. Preferably, the substantially uniformly radiating means is adapted to substantially uniformly radiate microwave energy from the waveguide for a dimension of greater than twelve inches. The radiating means may further include shutter means adapted to ensure that a substantially uniform density of microwave energy is emitted from the aperture means along the entire longitudinal extent thereof.

The apparatus preferably further includes applicator cooling means. The cooling means may be a flux of air adapted to flow about the interior of the isolating means. In another preferred embodiment, the cooling means may include a concentric enclosure formed interiorly of and shaped similarly to said isolating means so as to define a conduit between said isolating means and said concentric enclosure. It is into this conduit that a coolant fluid, examples of which include water, oils or freon, is adapted to flow.

It is to be specifically noted that in an alternative embodiment, the cylindrically-shaped isolating means of the instant patent application may further be employed with a conventional slow wave microwave applicator, which slow wave structure is adapted to couple microwave energy through an evanescent wave into the vessel. In other words, the ability to utilize thin isolating means insures that said isolating means can be thermally cooled to a sufficiently low temperature that relatively high power microwave energy can be introduced into the vacuum vessel and excite a high electron density plasma without the heat which is associated therewith cracking said isolating means.

These and other objects and advantages of the instant invention will become apparent from the Detailed Description, the Drawings and the Claims which follow hereinafter.

DETAILED DESCRIPTION OF THE INVENTION

The instant invention is a microwave energy apparatus for sustaining a substantially uniform plasma within an evacuated vessel. By maintaining the vessel at sub-atmospheric pressures, it is possible to operate the plasma at a pressure approximately that required for operation near the minimum of the modified Paschen curve, as defined in U.S. Pat. No. 4,504,518, col. 16, lines 44-52. Low pressure also allows for a longer mean free path of travel for the plasma excited species, thereby contributing to overall plasma uniformity. In this way, it is possible for the microwave energy apparatus to sustain a uniform plasma reaction upon a substrate disposed within the near field distance of the microwave source.

Figure 1:
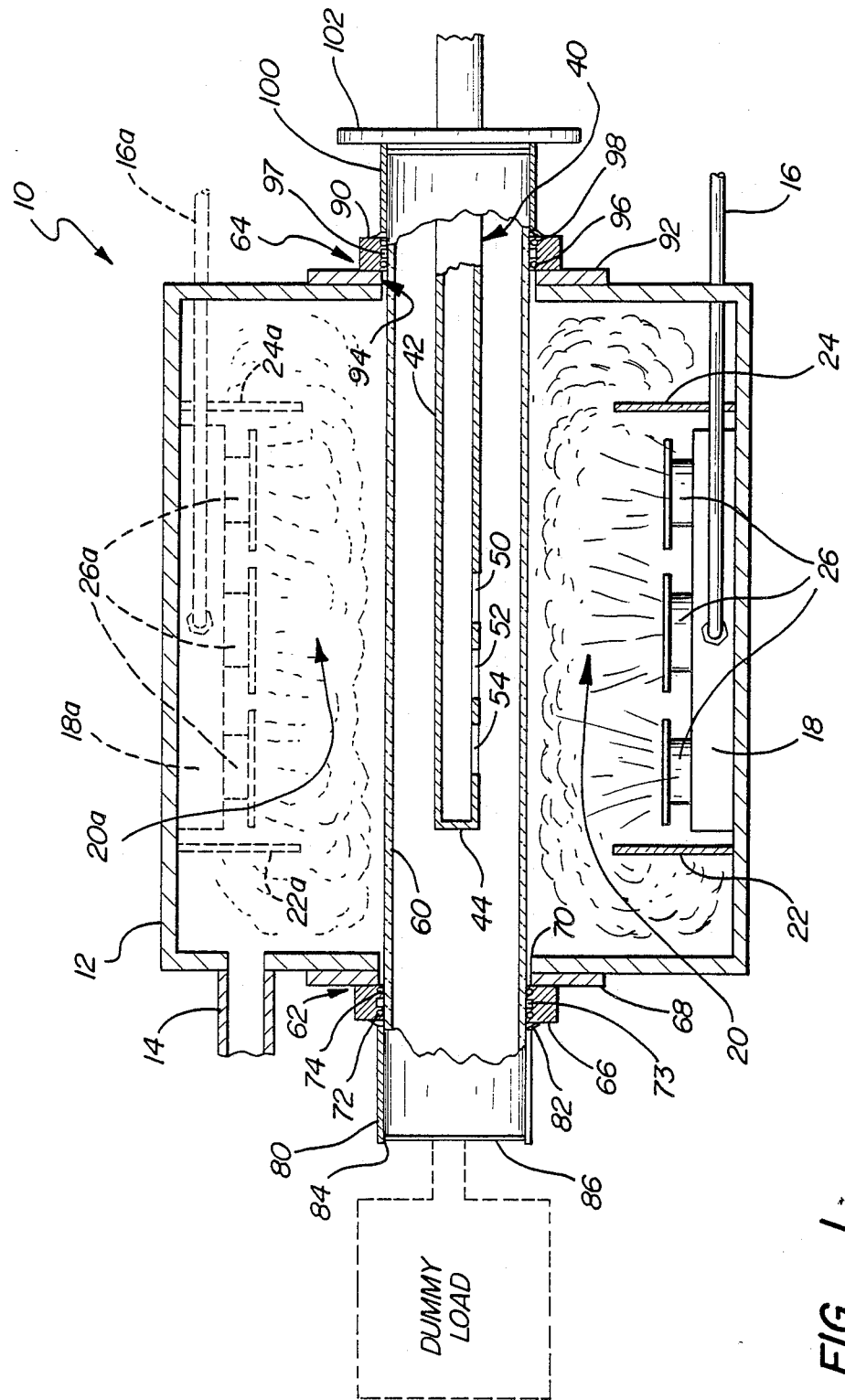
FIG. 1 is a cross-sectional view taken through a vacuum vessel illustrating the structural elements of the instant invention operatively disposed therein for effecting a uniform microwave plasma across an elongated, large area distance.

FIG. 1, illustrates in cross-sectional view a microwave energy apparatus 10 for sustaining a substantially uniform microwave plasma over a relatively large area. By "large area" is meant a body having at least one dimension greater than one microwave wavelength, and preferably greater then twelve inches. The apparatus 10 includes, inter alia, a vacuum vessel 12, the walls of which are preferably formed of a durable, corrosion resistant material such as stainless steel. The vacuum vessel 12 further includes a pump-out port 14 adapted for suitable connection to a vacuum pump, which vacuum pump is provided to maintain the interior of the vacuum vessel 12 at an appropriate sub-atmospheric pressure (vacuum) to sustain the plasma process therein. The vacuum pump is further adapted to remove reaction products from the interior of said vessel 12.

The vessel 12 further includes at least one process gas input line 16 connected to a process gas input manifold 18 which manifold 18 is operatively disposed so as to uniformly distribute process gases into the interior of said reaction vessel 12, and specifically into the plasma region 20 thereof. The process gas input manifold 88 is operatively disposed between at least a pair of process gas containment means 22 and 24. The process gas containment means 22, 24 contain the process gas introduced by the manifold 18 into the plasma region 20 of the vacuum vessel 12. Also present within the plasma region 20 are means for supporting a substrate or substrates 26. Though not shown, the vacuum vessel 12 may further include means for maintaining the substrate at a desired temperature, e.g., heating means or cooling means.

As will be discussed in detail hereinbelow, the substrate may include, but is not limited to, a single elongated member, a plurality of small substrates or a continuous web of substrate material. It is to be specifically noted however, that while the plasma region 20 is disposed at the bottom of the vacuum vessel 12, due to the highly uniform nature of the plasma sustained by the microwave energy apparatus 10, the plasma region 20 may in fact be located on the top, bottom or sides of the vacuum vessel 12. Indeed, as illustrated in FIG. 1 in phantom, the plasma region 20a may be located anywhere within the vessel 12. The substrate may be located at any distance from the microwave plasma source, though in a preferred embodiment, it is located a distance from said plasma source which does not exceed the near field distance of the microwave plasma source. This allows for relatively high gas utilization rates.

Figure 2:
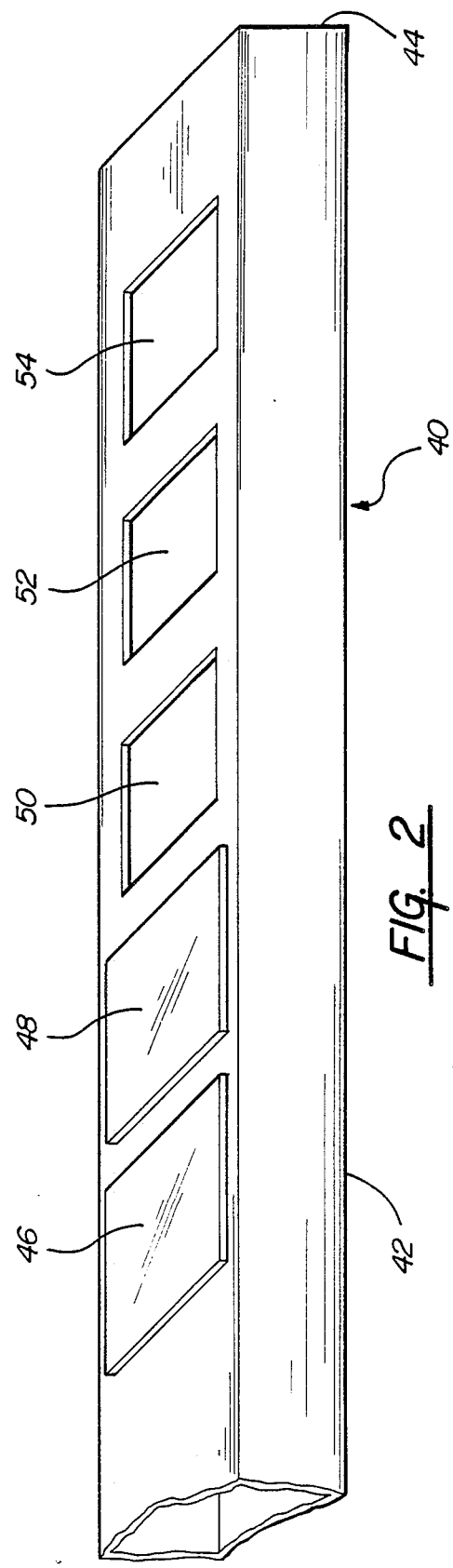
FIG. 2 is a partial perspective view illustrating a first embodiment of the radiative microwave applicator of the instant invention with spacedly disposed discrete apertures formed through one face thereof.

The microwave energy apparatus 10 further includes a microwave applicator means 40 which extends at least partially into the interior of said vacuum vessel 12. The microwave applicator means 40 is adapted to radiate microwave energy from a source thereof, into the interior of said vacuum vessel 12 for initiating and maintaining a plasma of the process gases introduced into said vessel 12 by process gas manifold 18. As is illustrated in FIG. 1, microwave applicator means 40 comprises a substantially rectangular waveguide means 42 having an open end portion 44 at the terminal end portion thereof extended into the vessel 12. The open end portion is adapted to avoid standing waves. It is to be understood that the applicator means 40 may alternatively be sealed at the terminal end thereof. The waveguide means 42 includes a plurality of apertures formed through one face thereof. The apertures are of dimensions and spacing to allow the waveguide to uniformly radiate microwave energy. Illustrated in greater detail in FIG. 2 is a partial perspective view of the microwave applicator means 40, including the rectangular waveguide 42 having terminal end portion 44, and a plurality of spacedly disposed apertures, 46, 48, 50, 52 and 54 formed through one face thereof. As is further illustrated in FIG. 2, apertures 46 and 48 are operatively blocked, as by waveguide material to prevent microwave energy from radiating therefrom. It is to be understood that the density of the microwave energy radiated by the microwave applicator means 40 can be distributed in a desired, controllable manner simply by blocking and unblocking various ones of the apertures formed through said waveguide means 42.

The inventors of the instant invention have found that the size of the apertures is of great significance, in that the leak rate through any one of said apertures is strongly dependent upon the size of that aperture. While the size of the aperture may be either larger or smaller than a wavelength of microwave energy, in the embodiment of FIG. 2 it is preferred that the aperture be the size of, or smaller than one wavelength of microwave energy. Additionally, the inventors have found that by partially unblocking the apertures as illustrated in FIG. 2, the apparatus 10 is capable of sustaining a plasma which is substantially uniform.

Figure 3:
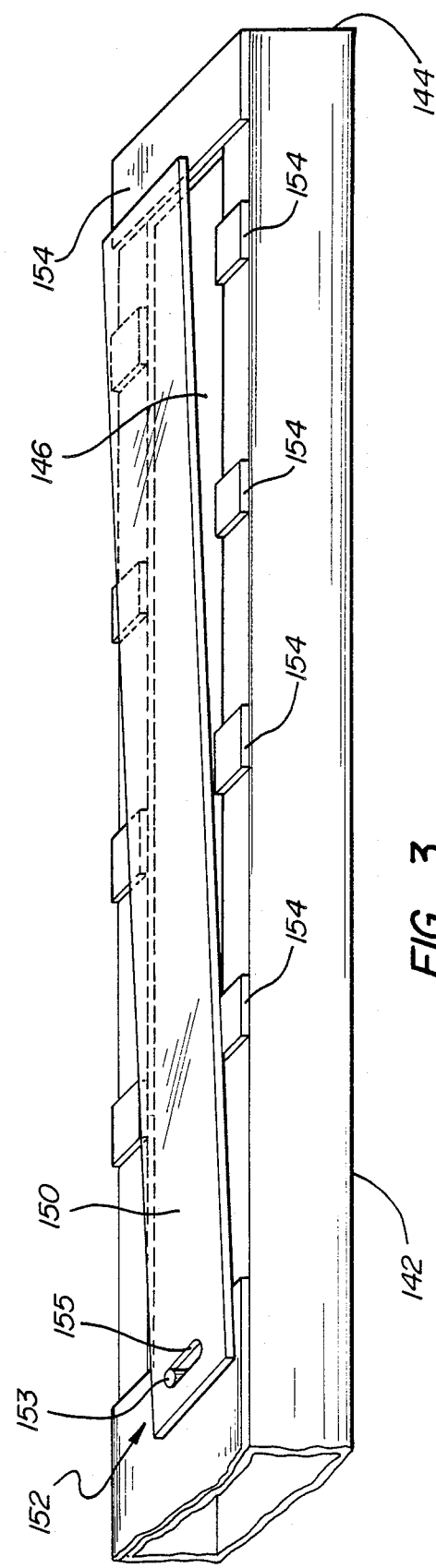
FIG. 3 is a partial perspective view illustrating a second embodiment of the radiative microwave applicator of the instant invention with a single elongated aperture formed through one face thereof and shutter means disposed thereover.

Alternatively, and as is illustrated in FIG. 3, the microwave applicator means 140 may include a microwave waveguide means 142 having an open end portion thereof 144 and a single elongated, rectangular aperture 146 which is larger than a wavelength of microwave energy, and formed through substantially the entire length and width dimension of one face of said rectangular microwave waveguide means 142. The open end portion is adapted to avoid standing wave problems, though a sealed end portion may be employed for a given application. The applicator means 140 so configured allows microwave energy to radiate from the entire aperture 146, though without more, the concentration of microwave energy is greatest at the end of the aperture nearest the source of microwave energy. The concentration of the microwave energy, and consequently the density of the plasma may however be regulated by employing at least one elongated either straight or slightly curved metallic microwave shutter 150 operatively affixed to said microwave waveguide means 142 by a single connection 152 consisting of, for example, a pin 153 through a channel 155, on the side of said waveguide means nearest to the source of microwave energy. Disposed at the opposite end of said elongated aperture 146, and along the edges of said aperture, are dielectric insulator means 154 fabricated from, for example glass or teflon. The dielectric insulator means 154 are adapted to form a insulating barrier between the waveguide means 142 and the microwave shutter 150. This is necessary since the microwave shutter 150 may be grounded to the waveguide means 142 only at the connection 152. Additional contact between the shutter 150 and the waveguide 142 will cause a so called "sizzling" ground, i.e., an arcing contact.

The applicator means shown and discussed in detail in connection with FIGS. 2 and 3 are of the type generally known as "leaky" microwave structures in that microwave energy is allowed to leak or radiate therefrom through a plurality of apertures. Alternatively, though not illustrated herein, the microwave applicator means may be a slow wave microwave structure. The slow wave structure delivers a significant part of microwave energy by means of evanescent waves. This type of slow wave structure was discussed hereinabove with reference to the Weissfloch, et al and Kieser, et al patents. The microwave energy apparatus 10 of the instant invention substantially obviates the shortcomings inherent in slow wave structures, i.e., the rapid fall off applied energy coupled to the plasma as a function of distance along the direction which is transverse to the microwave structure. This shortcoming is substantially obviated herein by inter alia, the use of means for isolating the microwave applicator from the plasma region, thereby allowing the applicator to sustain a more uniform plasma.

Returning now to FIG. 1, the apparatus 10 further comprises isolating means 60 for isolating the microwave applicator means 40 from the plasma region 20 within the vacuum vessel 12. The isolating means 60 is preferably fabricated from a dielectric material which is substantially transparent to microwave energy. A preferred material from which said isolating means 60 may be fabricated is quartz, though it is to be understood that many other materials may be employed with equal success. The isolating means 60 should further be configured in a shape designed to optimize its ability to withstand forces due to the presence of a pressure differential. In this manner, the thickness of the isolating means may be minimized to provide for effective thermal cooling whereby high microwave power densities may be employed without deleteriously effecting the isolating means. To this end, a preferred shape for said isolating means is a cylindrical or hemi-cylindrical shape adapted to encapsulate at least that portion of the applicator means 40 which extends into the vacuum vessel 12.

A cylindrical or hemi-cylindrical shape is preferred to for example a planar shape, because a cylinder may be made thinner than a planar shape due to the strength inherent in a cylinder. Thus, a thin cylinder is capable of withstanding pressures which would require a much thicker planar plate. Additionally, a thick plate cannot be maintained at a uniform, relatively low temperature, as can a thin cylinder. Thus, a planar plate may be subject to thermal degradation, in a microwave plasma apparatus particularly at elevated power levels. By contrast, the thin cylindrical isolating means 60 may be uniformly cooled, and thus does not experience thermal degradation, and therefore does not impose practical limitations upon the amount of power which may be applied.

Additionally, the applicator means 40 should be operatively disposed within the isolation means 60 and spaced apart from the circumferential wall thereof. So disposed, the applicator means 40 may extend partially through the vacuum vessel 12, without being exposed to the plasma region 20 contained therein.

The cylindrical isolating means 60 of FIG. 1 is configured so as to be coextensive with at least one dimension of the vacuum vessel 12, and protrude through at least a first and second wall portion of said vacuum vessel 12. The cylindrical isolating means 60 are fixed through the walls of the vacuum vessel 12 by means of two collar fittings 62 and 64. Collar fittings 62 and 64, like reaction vessel 12 are preferably fabricated from a suitable non-corrosive material such as stainless steel, with the collar fittings 62 and 64 preferably being mountably joined to the vessel 12. Collar fitting 62 comprises an open end portion 66 extended from a connection flange 68. Connection flange 68 is affixed directly to a side wall of the vacuum vessel 12, and includes an opening 70 co-extensive with the circumference of the cylindrical isolating means 60 and adapted to receive cylindrical isolating means 60. Open end portion 66 extends from said connection flange 68, and is adapted to receive at least two O-rings 72, 74, which O-rings 72, 74 are adapted to effect a vacuum and water barrier between the interior of said vacuum vessel 12 and outside ambient conditions. Between O-rings 72, 74 is disposed a cooling channel 73, through which a cooling medium such as water may be circulated so as to maintain the O-rings at a uniformly low temperature. The O-rings 72, 74 are preferably adapted to maintain the vacuum and water seal at substantially elevated temperatures, i.e., temperatures in excess of 100° Centigrade.

The cylindrical isolating means 60 passes through opening 70, connection flange 68, and the open end portion 66. In this way, O-rings 72, 74 are urged against the outside circumference of said cylindrical isolating means 60. The compression of the O-rings 72, 74 against the cylindrical isolating means 60 results in an air tight, water tight seal. It is important to note that the location of O-rings 72, 74 is well outside the plasma region 20 of the apparatus 10. This is noteworthy because by keeping the O-rings out of the plasma region 20, they are not exposed to the excessive temperatures associated with microwave plasmas, i.e., temperatures in excess of 500° centigrade. Had the O-ring seals been located within the plasma region, as shown in the aforementioned U.S. Pat. No. 4,729,341, special (and costly) high temperature resistant seals would have been required, greatly increasing the complexity and cost of the apparatus 10.

The cylindrical isolating means 60 may extend beyond the outside terminal edge of said open end portion 66. This portion of the cylindrical isolating means 60 must thus be equipped with microwave containment means 80. The microwave containment means 80 is typically fabricated from a metal microwave containment canister operatively affixed around the outside circumference of the cylindrical isolating means 60, and in electrical contact with said open end portion 66 by grounding fingers 82. The microwave containment canister is fabricated so as to be coextensive with that portion of cylindrical isolating means 60 which extends beyond the open end portion 66. Additionally, the microwave containment means 80 further includes an open end portion 84 over which is disposed a metallic microwave blocking mesh 86 adapted to contain stray microwaves therewithin. The mesh 86 is also adapted to allow for the passage of a flux of cooling air through the cylindrical isolating means 60. Alternatively, and as is illustrated in phantom in FIG. 1, the open end portion 84 of the microwave containment canister 80 may be attached to a dummy load adapted to absorb excess microwave radiation. This embodiment is particularly useful at high power levels, where excess reflected microwave energy causes reflection modes which may degrade the uniformity of the microwave plasma.

The vacuum vessel 12 is further adapted to receive the cylindrical isolating means 60 through at least a second wall portion thereof, preferably the wall portion opposite the wall portion upon which collar fitting 62 is mounted. Collar fitting 64 is disposed on said opposite wall position, substantially in line with collar fitting 62. Collar fitting 64 comprises an open end portion 90 extended from a connection flange 92. Connection flange 92 is affixed directly to the opposite wall portion and includes an opening 94 co-extensive with the circumference of the cylindrical isolating means 60, and adapted to receive the isolating means 60. The open end portion 90 extends from the connection flange 92, and is adapted to receive at least two O-rings 96, 98 which are adapted to effect a vacuum and water barrier between the plasma region 20 within the vacuum vessel 12 and the surrounding ambient conditions. Between O-rings 96, 98 is disposed a cooling channel 97, through which a cooling medium such as water may be circulated so as to maintain the O-rings at a uniformly low temperature. The O-rings 96, 98 like O-rings 72, 74 are adapted to withstand elevated temperatures. The cylindrical isolating means 60 is passed through opening 94, through connection flange 92 and open end portion 90 whereby O-rings 96, 98 are urged against the outside circumferential edge of said cylindrical isolating means 60. The compression of said O-rings is the mechanism by which an air tight, water tight seal is effected. Also, O-rings 96, 98, like O-rings 72, 74, are well out of the plasma region 20, and therefore not subjected to degradation thereby.

By effecting an air-tight, water tight seal around the outer circumference of the cylindrical isolating means 60, it is possible to maintain the plasma region 20 at substantially sub-atmospheric pressures, while the interior of the cylindrically isolating means 60 is maintained at atmospheric pressures, and is directly exposed to ambient conditions. This is in fact an advantage in the operation of the apparatus 10. By maintaining the vacuum vessel at sub-atmospheric pressures, it is possible to operate the apparatus 10 at a pressure approximating that required for operation near the minimum of a modified Paschen curve. Additionally, the low pressures allow for a longer mean free path of travel for the plasma species, thereby contributing to overall plasma uniformity. Since the interior of the cylindrical isolating means 60 is exposed to ambient conditions, a flux of cooling air may be maintained therethrough so as to prevent the excessive heating which may be associated with microwave plasmas. Alternatively, a microwave transmissive cooling medium such as silicon oil may be circulated within the cylinder to maintain a uniform, cool temperature. The cylindrical isolating means 60, extending beyond the open end portion 90 must be sheathed within a metallic microwave containment means 100, of the type described hereinabove. The microwave containment means 100 is disposed adjacent to connection plate 102 which affects a connection between the microwave applicator means 40, and a source of microwave energy.

Figure 4:
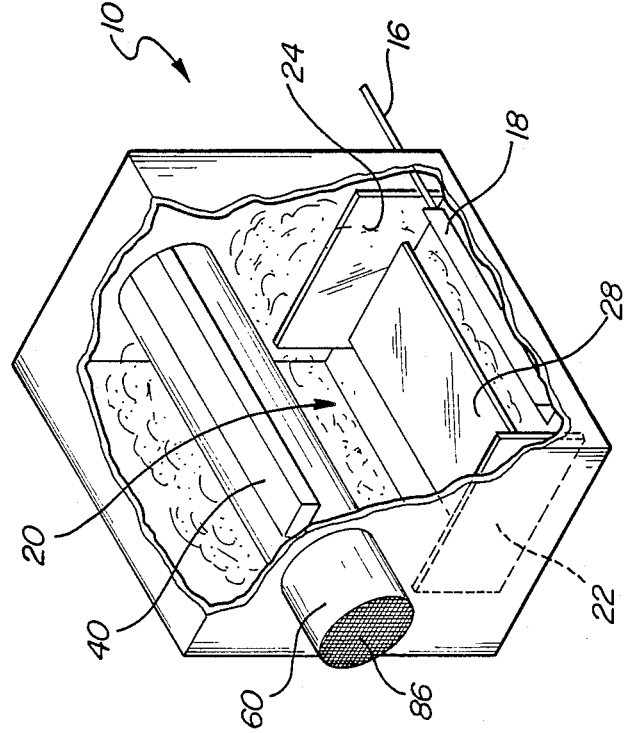
FIG. 4 is a perspective view of a vacuum vessel of reduced dimension and of the type depicted in FIG. 1, partially cut-away, illustrating a single, elongated substrate operatively disposed relative to the radiative microwave applicator so as to have a plasma operation performed on the upper surface thereof.

As described hereinabove, and as is illustrated in FIG. 1, the apparatus 10 defines a plasma region 20 into which is disposed a substrate 28, at a distance not in excess of the distance defined by the near field distance of the microwave applicator means 40. In a first embodiment, and as is illustrated in FIG. 4 where like reference number refer to like structures, the substrate 28 disposed into said plasma region 20 may take the form of a single, elongated planar or slightly curved substrate member. Said planar substrate member 28 is operatively disposed between the process gas containment means 22, 24 and within the near field distance of the applicator means 40.

Figure 6:
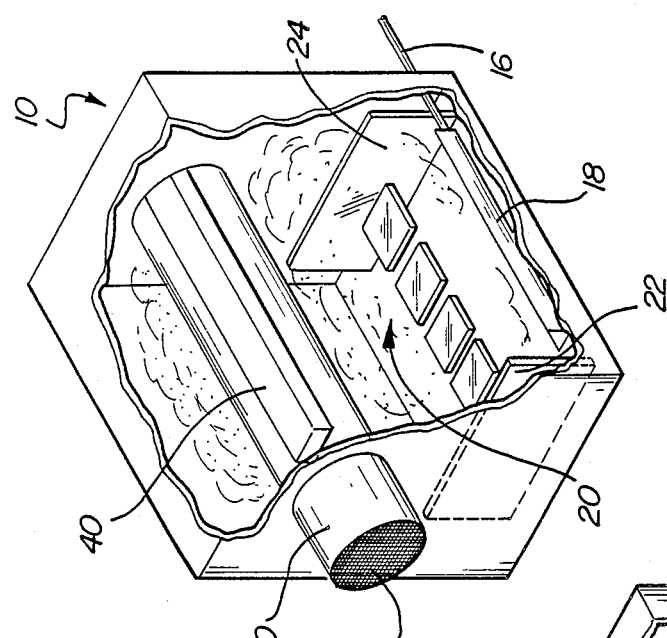
FIG. 6 is a perspective view of a vacuum vessel of reduced dimension and of the type depicted in FIG. 1, partially cut-away, illustrating a plurality of spaced, discrete small away substrates operatively disposed relative to the radiative microwave applicator so as to have a plasma operation performed on the upper surfaces thereof.
Figure 5:
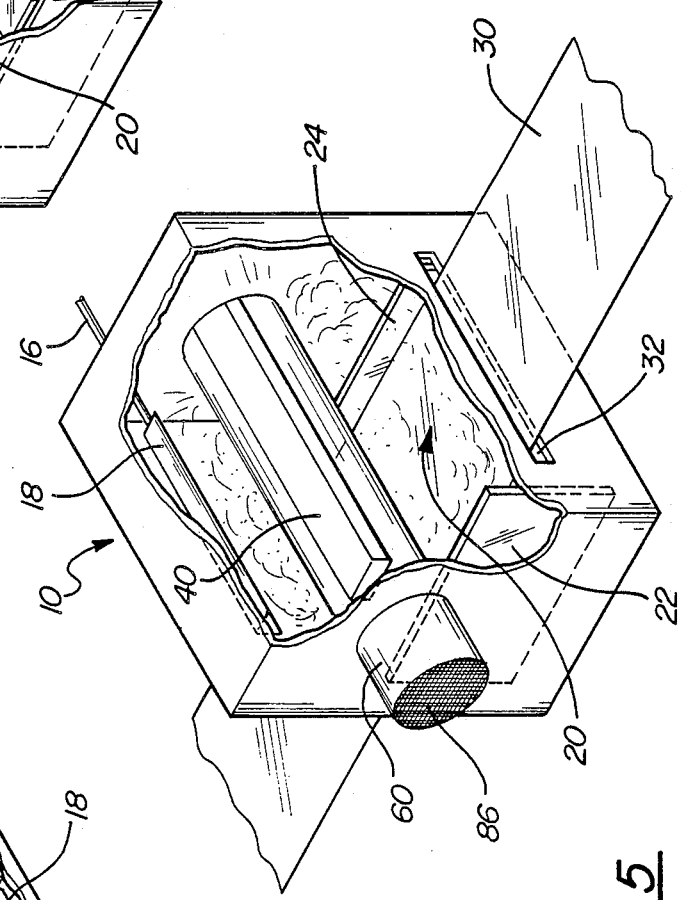
FIG. 5 is a perspective view of a vacuum vessel of reduced dimension and of the type depicted in FIG. 1, partially cut-away, illustrating a continuous web of substrate material operatively disposed relative to the radiative microwave applicator so as to have a plasma operation performed on the upper surface thereof.

In another embodiment illustrated in FIG. 5, the substrate member 28 may take the form of an elongated, substantially continuous roll of substrate material 30. In the case of a continuous roll of substrate the apparatus 10 is modified so as to allow the continuous progress of substrate material therethrough. Required modifications would include gate means 32 adapted to allow the free passage of the substrate member into and out of the vacuum vessel 12, while maintaining the vacuum and containing both the process gases and the microwave plasma. A preferred gate means 32 for containing the reaction gases and microwave plasma within the vacuum vessel 12 is disclosed in U.S. Pat. No. 4,438,723 to Cannella, et al, the disclosure of which is incorporated herein by reference. In yet another embodiment, and as is illustrated in FIG. 6, the substrate comprises a plurality of individual work pieces 34 supported in the plasma region 20 by substrate support means 26, and operatively disposed so as to have a plasma operation performed upon the upper surfaces thereof.

As was discussed hereinabove, while each embodiment is illustrated with the substrate members 28 disposed below the applicator means 40, due to the substantially uniform nature of the plasma, the plasma region may be located anywhere within the near field distance of the applicator means 40. The input gas manifold 18 may provide into the plasma region 20 a process material as metallic material, semiconductor material, and dielectric material upon the substrate. In yet another embodiment, the precursor gases introduced into the plasma region decompose and deposit a clear, hard film onto the substrate. In another embodiment, at least one etchant precursor gas may be introduced into the plasma region 20, whereby the apparatus 10 is adapted to etch the surface of a substrate means located therewithin. An example of a deposition follows hereinafter.

EXAMPLE

The microwave deposition apparatus 10 described hereinabove was employed to fabricate a hard, clear silicon based coating upon a plurality of individual glass substrates. The exact steps by which the above described apparatus 10 is used to fabricated such coatings and deposits will be detailed hereinbelow.

A plurality of substrate means fabricated of glass were cleaned by common cleaning agents well known to those skilled in the art. The glass substrates were loaded in the plasma region 20 of apparatus 10 described hereinabove. After placing the glass substrates within the plasma region 20, the apparatus 10 was closed and sealed so as to effect an air tight seal between the interior of the vessel and the surrounding ambient conditions. The interior of the vessel was then evacuated to a pressure of approximately 20 to 25 millitorr. Thereafter, the interior of said chamber was purged in an argon gas environment for a period of approximately one-half hour. After purging for approximately one-half hour, the chamber was evacuated to a background pressure of approximately 3 to 4 millitorr. Thereafter, preferred feedstock gases were introduced to the interior of said chamber through said input gas manifold 18 according to the following recipe:

| Gas | Flow Rate |
| --- | --- |
| $SiH_4$ | 110 SCCM |
| $SiF_4$ | 31 SCCM |
| $N_2$ | 475 SCCM |
| $CO_2$ | 875 SCCM |
| $C_2H_2$ | 14 SCCM |

After initiating the flow of these feedstock gases into the interior of the vacuum vessel, a microwave plasma was initiated, and at a frequency of 2.45 GHz at a power of approximately 5 kilowatts. The microwave plasma was maintained for a period of time adapted to deposit a coating. During the operation of the microwave plasma, a flux of cooling air was directed through the cylindrical isolating means 60 so as to maintain a uniform low temperature. Thereafter, microwave plasma was extinguished, and the flow of process gases to the vacuum vessel 12 was terminated.

After extinguishing the plasma and terminating the flow of process gases to the vacuum vessel 12, the interior of the reaction vessel was purged with argon, and the reaction vessel was vented to ambient conditions. Thereafter, the reaction vessel was opened and the substrate was removed for examination which revealed a uniform, clear hard silicon based coating.

While the invention has been described in connection with preferred embodiments and procedures, it is to be understood that it is not intended to limit the invention to the described embodiments and procedures. On the contrary it is intended to cover all alternatives, modifications and equivalence may be included within the spirit and scope of the invention as defined by the claims appended herein and after.

What is claimed is:

1. Microwave energy apparatus for sustaining a substantially uniform plasma over a relatively large area, comprising:
   a vacuum vessel for initiating and sustaining a plasma in a plasma region thereof;
   means in said vessel for supporting substrate means in operative juxtaposition relative to the plasma region;
   means for maintaining said vessel at a desired, relatively low substantially sub-atmospheric pressure;
   means for introducing process gases into said vessel;
   non-evanescent applicator means at least partially extending into the interior of said vessel, said applicator means adapted to substantially uniformly radiate microwave energy from a source into the interior of said vessel for sustaining a plasma from the process gases introduced thereinto;
   means for isolating the microwave radiating applicator means from the plasma region; said isolating means (1) formed from a material through which microwave energy can be radiated from said applicator means into said vessel, and (2) configured in a shape substantially optimized to withstand pressure differentials, whereby the thickness of the isolating means may be minimized and the microwave radiating applicator means and the isolating means are adapted to perform a substantially uniform plasma operation along an elongated surface of substrate means disposed in said vessel.

2. Apparatus as in claim 1, wherein said isolating means is configured in a substantially cylindrical shape.

3. Apparatus as in claim 1, wherein said isolating means is configured in a substantially hemi-cylindrical shape.

4. Apparatus as in claim 2, wherein said cylindrically shaped isolating means encapsulates at least that portion of said applicator means which extends into said vessel.

5. Apparatus as in claim 4, wherein said applicator means is operatively disposed in said isolating means so as to be spaced from the circumferential wall thereof.

6. Apparatus as in claim 2, further including means forming a vacuum seal disposed between said cylindrically shaped isolating means and said vessel.

7. Apparatus as in claim 6, wherein a pressure differential is maintained between the interior and exterior of said cylindrically-shaped isolating means.

8. Apparatus as in claim 7, further including means for maintaining the pressure within the interior of said cylindrically shaped isolating means at substantially atmospheric levels.

9. Apparatus as in claim 8, wherein said pressure maintaining means is adapted to maintain the pressure of said vessel disposed exteriorly of said cylindrically-shaped isolating means at a pressure approximating that required for operation at the minimum of a modified Paschen curve.

10. Apparatus as in claim 1, wherein the thickness of the circumferential wall of said isolating means is designed to withstand the pressure differential existing between the exterior and interior thereof.

11. Apparatus as in claim 1, further including at least one semiconductor-containing precursor gas provided for introduction into the interior of said vacuum vessel, wherein said apparatus is adapted to deposit semiconductor material onto a substrate means.

12. Apparatus as in claim 1, further including at least one etchant-containing precursor gas provided for introduction into the interior of said vessel, whereby said apparatus is adapted to etch a substrate means.

13. Apparatus as in claim 1, further including precursor gases adapted to decompose and deposit an insulating film onto the substrate means, said precursor gases provided for introduction into the interior of said vessel.

14. Apparatus as in claim 1, wherein said applicator means is an elongated waveguide, said waveguide including rectangularly-shaped means for substantially uniformly radiating microwave energy therefrom and into the interior of said vessel.

15. Apparatus as in claim 14, wherein said rectangularly-shaped waveguide is elongated along a longitudinal axis thereof and one of the faces thereof includes at least one aperture means formed therethrough for emitting microwaves therefrom.

16. Apparatus as in claim 15, wherein said aperture means includes a plurality of apertures, said apertures spacedly positioned along the longitudinal extent of said rectangularly-shaped waveguide.

17. Apparatus as in claim 15, wherein said aperture means includes a single elongated aperture.

18. Apparatus as in claim 15, further including elongated substrate means operatively disposed by said supporting means in said vessel and wherein the length of said aperture means is substantially coextensive with the length of said elongated substrate.

19. Apparatus as in claim 18, wherein said substrate means is a single elongated member.

20. Apparatus as in claim 18, wherein said substrate means includes a plurality of discrete substrate members aligned along the longitudinal extent of said waveguide.

21. Apparatus as in claim 18, wherein said substrate means is an elongated web adapted to be continuously moved past the longitudinal extent of said waveguide.

22. Apparatus as in claim 14, wherein said uniformly radiating means is adapted to uniformly radiate microwave energy from said waveguide for a dimension of greater than one wavelength of radiated microwaves.

23. Apparatus as in claim 22, wherein said uniformly radiating means is adapted to uniformly radiate microwave energy from said waveguide for a dimension of greater than twelve inches.

24. Apparatus as in claim 15, wherein said uniformly radiating means further includes shutter means adapted to ensure that a substantially uniform density of microwave energy is emitted from said aperture means along the entire longitudinal extent thereof.

25. Apparatus as in claim 1, further including means for cooling said isolating means.

26. Apparatus as in claim 25, wherein said cooling means includes a flux of air adapted to flow about the interior periphery of said isolating means.

27. Apparatus as in claim 25, wherein said cooling means includes a similarly-shaped concentric enclosure formed interiorly of said isolating means for defining a conduit between said isolating means and said concentric enclosure; and a coolant fluid adapted to flow through said conduit.

28. Apparatus as in claim 1, further including substantially planar substrate means.

29. Apparatus as in claim 28, wherein said substrate means is operatively juxtaposed within a near field distance of said applicator means.

30. Microwave energy apparatus for sustaining a substantially uniform plasma over a relatively large area, comprising:
a vacuum vessel for initiating and sustaining a plasma is a plasma region thereof;
means in said vessel for supporting substrate means in operative juxtaposition relative to the plasma region;
means for maintaining said vessel at a desired, relatively low substantially sub-atmospheric pressure;
means for introducing process gases into the vacuum vessel;
applicator means at least partially extending into the interior of said vessel, said application means adapted to transmit microwave energy from a source into the interior of said vessel for sustaining a plasma from the process gases introduced thereinto;
cylindrically-shaped means encapuslating at least that portion of said applicator means which extends into the interior of said vessel for isolating the microwave applicator means from the plasma region; said isolating means formed from a material through which microwave energy can be transmitted from said applicator means into said vessel; whereby said microwave applicator means and said isolating means are adapted to perform a substantially uniform plasma operation along an elongated surface of substrate means disposed in said vessel.

31. Apparatus as in claim 30, wherein said applicator means is adapted to radiate microwave energy into said vessel.

32. Apparatus as in claim 30, wherein said applicator means is a slow wave structure adapted to propagate evanescent microwave movement as said microwave energy is transmitted into said vessel.

33. Apparatus as in claim 30, wherein said applicator means is operatively disposed in said isolating means so as to be spaced from the circumferential wall thereof.

34. Apparatus as in claim 30, further including means forming a vacuum seal disposed between said cylindrically shaped isolating means and said vessel.

35. Apparatus as in claim 34, wherein a pressure differential is maintained between the interior and exterior of said cylindrically-shaped isolating means.

36. Apparatus as in claim 35, further including means for maintaining the pressure within the interior of said cylindrically shaped isolating means at substantially atmospheric levels.

37. Apparatus as in claim 36, wherein said pressure maintaining means is adapted to maintain the pressure of said vessel disposed exteriorly of said cylindrically-shaped isolating means at a pressure approximating that required for operation at the minimum of a modified Paschen curve.

38. Apparatus as in claim 30, wherein the thickness of the circumferential wall of said isolating means is designed to withstand the pressure differential existing between the exterior and interior thereof.

39. Apparatus as in claim 30, further including at least one semiconductor-containing precursor gas provided for introduction into the interior of said vessel, wherein said apparatus is adapted to deposit semiconductor material onto a substrate means.

40. Apparatus as in claim 30, further including at least one etchant-containing precursor gas provided for introduction into the interior of said vessel, whereby said apparatus is adapted to etch a substrate means.

41. Apparatus as in claim 30, further including precursor gases adapted to decompose and deposit an insulating film onto the substrate means, said precursor gases provided for introduction into the interior of said vessel.

42. Apparatus as in claim 30, wherein said applicator means is an elongated slow waveguide, said waveguide including ladder-like means for substantially uniformly transmitting microwave energy therefrom into the interior of said vessel.

43. Apparatus as in claim 42, further including elongated substrate means operatively disposed by said supporting means in said vessel and wherein the length of said ladder-like means is substantially coextensive with the length of said elongated substrate.

44. Apparatus as in claim 42, wherein said substrate means is a single elongated member.

45. Apparatus as in claim 42, wherein said substrate means includes a plurality of discrete substrate members aligned along the longitudinal extent of said waveguide.

46. Apparatus as in claim 42, wherein said substrate means is an elongated web adapted to be continuously moved past the longitudinal extent of said waveguide.

47. Apparatus as in claim 42, wherein said uniformly transmitting means is adapted to uniformly transmit microwave energy from said waveguide for a dimension of greater than one wavelength of the microwaves being transmitted.

48. Apparatus as in claim 47, wherein said uniformly transmitting means is adapted to uniformly transmit microwave energy from said waveguide for a dimension of greater than twelve inches.

49. Apparatus as in claim 42, wherein said uniformly transmitting means further includes shutter means adapted to ensure that a substantially uniform density of microwave energy is emitted from the entire longitudinal extent of said waveguide.

50. Apparatus as in claim 30, further including means for cooling said isolating means.

51. Apparatus as in claim 50, wherein said cooling means includes a flux of air adapted to flow about the interior periphery of said isolating means.

52. Apparatus as in claim 50, wherein said cooling means includes a concentric cylinder disposed interior of said isolating means for defining a conduit between said isolating means and said concentric cylinder; and a coolant fluid adapted to flow through said conduit.

53. Apparatus as in claim 30, further including substantially planar substrate means.

54. Apparatus as in claim 53, wherein said substrate means is operatively juxtaposed within a near field distance of said application means.

* * * * *